United States Patent [19]

Gloanec et al.

[11] Patent Number: 5,025,212
[45] Date of Patent: Jun. 18, 1991

[54] CIRCUIT FOR MEASURING THE DYNAMIC CHARACTERISTICS OF A PACKAGE FOR HIGH-SPEED INTEGRATED CIRCUITS AND A METHOD FOR MEASURING SAID DYNAMIC CHARACTERISTICS

[75] Inventors: Maurice Gloanec, Bures sur Yvette; Jacques Jarry, St Cyr L'Ecole; Jean L. Lailler, Bures sur Yvette, all of France

[73] Assignee: Thomson Hybrides et Microondes, Paris, France

[21] Appl. No.: 407,589

[22] Filed: Nov. 3, 1989

Related U.S. Application Data

[63] Continuation of Ser. No. 122,125, Nov. 18, 1987.

[30] Foreign Application Priority Data

Nov. 18, 1986 [FR] France .................. 86 15996

[51] Int. Cl.⁵ ......................................... G01R 19/155
[52] U.S. Cl. .............................. 324/158 R; 324/158 F
[58] Field of Search ............... 324/158 F, 158 R, 73.1; 330/307

[56] References Cited

U.S. PATENT DOCUMENTS

| 4,454,481 | 6/1984 | Lewis | 330/307 |
| 4,535,307 | 8/1985 | Tsukii | 333/35 |
| 4,588,962 | 5/1986 | Saito et al. | 330/286 |
| 4,734,641 | 3/1988 | Byrd, Jr. et al. | 374/44 |

FOREIGN PATENT DOCUMENTS 2529385 12/1983 France .

*Primary Examiner*—Reinhard J. Eisenzopf
*Assistant Examiner*—Edward Urban
*Attorney, Agent, or Firm*—Oblon, Spivak, McClelland, Maier & Neustadt

[57] ABSTRACT

A circuit for measuring the dynamic characteristics of encapsulating packages for high-speed integrated circuits includes at least two amplifiers integrated on a semiconductor substrate. These amplifiers have the same input and output impedances as those of the high-speed circuit to be encapsulated within the package. The amplifiers are located in widely spaced relation in order to ensure that there is no internal coupling. Depending on the measurements to be performed, the two amplifiers are mounted in parallel or in antiparallel relation. In order to measure the dynamic characteristics of a package, a measuring circuit is mounted within a package and a signal ($V_e$) is addressed to an input connection of the package. The transmission and coupling coefficients are deduced from measurement of the signal ($V_S$) collected on an output connection.

3 Claims, 1 Drawing Sheet

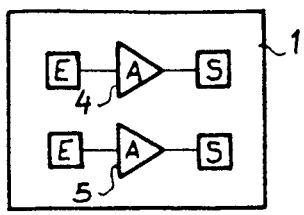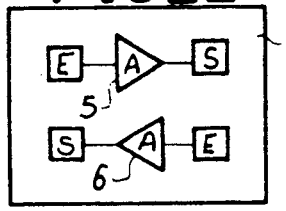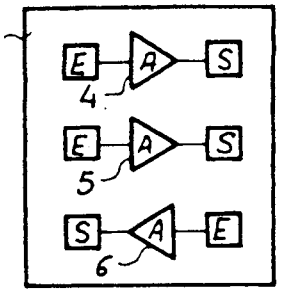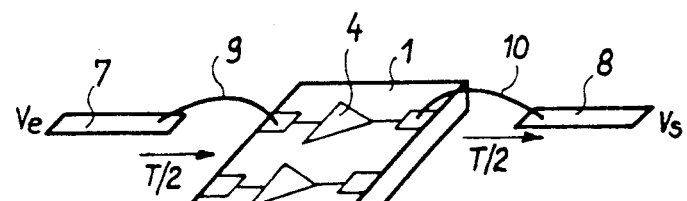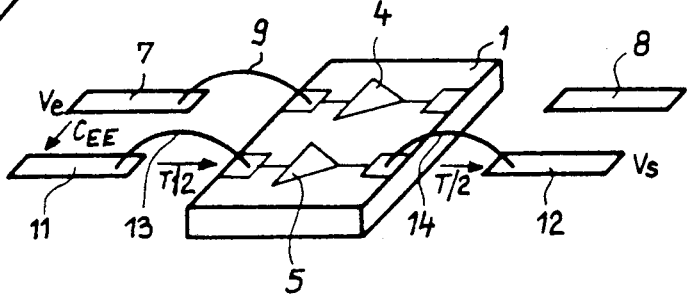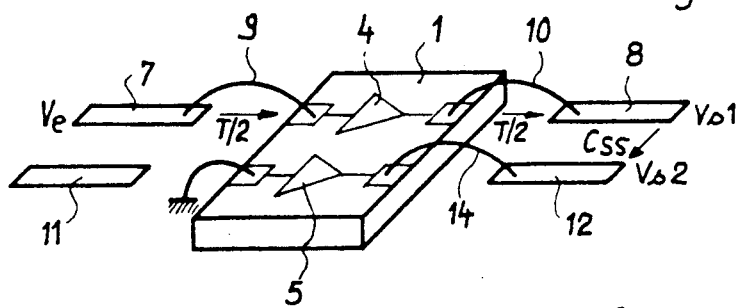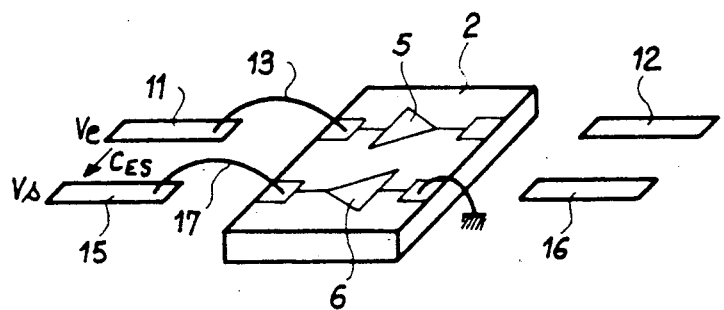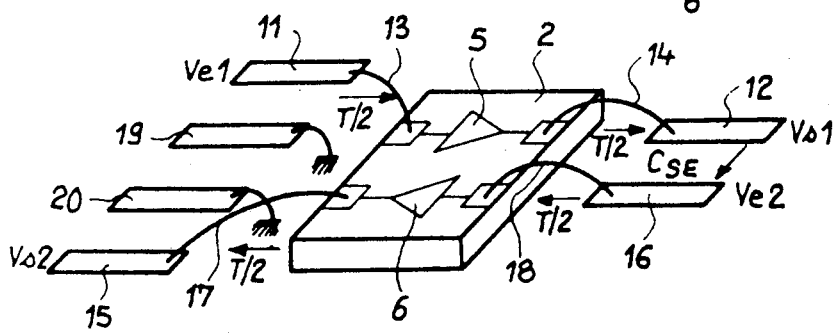

CIRCUIT FOR MEASURING THE DYNAMIC CHARACTERISTICS OF A PACKAGE FOR HIGH-SPEED INTEGRATED CIRCUITS AND A METHOD FOR MEASURING SAID DYNAMIC CHARACTERISTICS

This is a continuation of application Ser. No. 07/122,125, filed on Nov. 18, 1987.

BACKGROUND OF THE INVENTION

1. Field of the Invention

The present invention relates to a device for determining the dynamic performances of an encapsulating package for a high-speed integrated circuit of the logic or linear type on gallium arsenide or III–V materials. The invention is also concerned with a method for testing the dynamic characteristics of a package by means of the device in accordance with the invention.

2. Description of the Prior Art

The development of new techniques for integrated circuits on gallium arsenide (GaAs) or ternary GaAlAs compounds of the III–V family, such circuits being designed for operating frequencies above 1 GHz, calls for availability of encapsulation means having very high speed performances.

The problem presented by encapsulation of these so-called subnanosecond integrated circuits consists in assembling a component within a package without thereby affecting the intrinsic electrical performances of the encapsulated integrated circuit. In the great majority of instances, packages for this type of integrated circuit consist of flat ceramic cases or so-called flat packs. Thus French patent Application No. 82 11 399 filed in the name of the present Applicant discloses a flat pack having external connections consisting entirely of impedance-matched microstrips. This package constitutes a highly advantageous improvement in the encapsulation of high-speed circuits.

The object of the present invention is to provide a device and a method which permit measurement in situ (that is to say under real conditions of operation of integrated circuits) of the electrical performances of packages which operate at very high frequency such as those described in the patent Application cited earlier.

SUMMARY OF THE INVENTION

The device in accordance with the invention consists of a set of two identical amplifiers or preferably three identical amplifiers integrated on one and the same chip of semiconductor material and connected in parallel, each amplifier being provided with an input terminal and an output terminal which are independent of the input and output terminals of the other amplifiers. Two amplifiers are integrated in parallel with adjacent input terminals and adjacent output terminals and two amplifiers are integrated in top-to-tail relation.

The method consists in mounting said amplifier chip within the package whose characteristics are to be measured at very high speed, and in measuring the coefficients of transmission of the package between external access connections selected in pairs on different sides of the package.

More specifically, the invention relates to a circuit for measuring the dynamic characteristics of an encapsulating package for high-speed integrated circuits ($\geq 1$ GHz), said measuring circuit being distinguished by the fact that it includes on a supporting substrate of semiconductor material at least two identical amplifiers in which:

the input impedance corresponds to the input impedance of the integrated circuit to be encapsulated within the package, the output impedance is identical with the output impedance of said integrated circuit, the power supplies are separate and the implantation pattern has a very wide spacing in order to ensure that there is no electrical coupling, the metallizations of the input and output terminals are located on the edges of the substrate in order to minimize the length of the external connections, said edges being selected opposite to the edges of the encapsulating package which support external access connections.

BRIEF DESCRIPTION OF THE DRAWINGS

FIGS. 1 and 2 illustrate two chips carrying amplifiers which are mounted in parallel and in antiparallel, in with the invention.

FIG 3 illustrates a chip carrying three amplifiers including one amplifier mounted in antiparallel and constituting an alternative embodiment of the invention with respect to FIGS. 1 and 2.

FIG. is a diagram of the method in accordance with the invention for measuring the coefficient of transmission of a package.

FIG. 5 is a diagram of the method in accordance with the invention for measuring the coefficient of coupling between two access connections employed as inputs.

FIG. 6 is a diagram of the method in accordance with the invention for measuring the coefficient of coupling between two access connections employed as outputs.

FIG. 7 is a diagram of the method in accordance with the invention for measuring the coefficient of coupling between an access connection employed as input and an access connection employed as output, these connections being placed side by side.

FIG. 8 is a diagram of the method in accordance with the invention for measuring the coefficient of coupling between an access connection employed as output and an access connection employed as input, these connections being separated by a screen.

DETAILED DESCRIPTION OF THE INVENTION

Apart from mechanical performances such as hermetic sealing or heat-removal capacity, the quality of a package employed at high frequencies is directly related to its ability to carry high-speed signals from the external environment (supporting board) to the integrated circuit chip. This can be summarized by two electrical quality criteria:

electrical transmission of the access connections, electrical decoupling between the different access connections.

The first criterion characterizes the low degradation of the traveling signals. The second criterion characterizes the low crosstalk between access connections which may be the cause of undesirable parasitic signals.

Measurement of these two parameters in real value is extremely difficult since, in order to judge the quality of connections which have been made, this measurement would entail the need to collect the electrical quantities from the integrated circuit itself.

The device in accordance with the invention makes it possible to carry out quantitative measurements of the dynamic performances of a package, primarily in terms of coupling in a real environment.

This parameter is a very important datum, especially in the field of encapsulation of signal-processing linear integrated circuits which make use of very precise analog quantities having small amplitudes together with clock signals having high levels and a frequency which can be higher than 1 GHz.

A full analysis of specifications of packages calls for availability of two types of circuits as illustrated schematically in FIGS. 1 and 2.

In a first case as shown in FIG. 1, two amplifiers 4 and 5 are integrated on a chip 1 of semiconductor material in accordance with an implantation pattern or layout such that they are mounted in parallel. Thus the two input terminals are in side-by-side relation on the same edge of the substrate 1 whilst the two output terminals are located side-by-side on an opposite edge of the substrate.

In a second case as shown in FIG. 2, two amplifiers 5 and 6 are integrated on a chip 2 of semiconductor material but are located in this instance in an antiparallel or top-to-tail arrangement. Thus the input terminal of the amplifier 5 is adjacent on one edge of the substrate 2 to the output terminal of the amplifier 6 and the output terminal of the amplifier 5 is adjacent on an opposite edge of the substrate to the input terminal of the amplifier 6.

The use of these two types of circuit will be explained hereinafter and corresponds to measurements on access connections located on two opposite edges of a package. If measurements are to be made on access connections located in two adjacent edges of a package having peripheral connections, the implantation patterns of the amplifiers are such that the input and output terminals are on two adjacent edges of the substrate 1 or 2 so as to ensure that the metallic strip connections between the circuit position and the external connections are as short as possible in order to avoid any introduction of new elements in the measurement of the characteristics of a package.

Should it be necessary to employ both types of circuit as illustrated in FIGS. 1 and 2, which depends on the measurements to be made on a package, the circuit illustrated in FIG. 3 offers an effective solution. Three amplifiers 4, 5 and 6 are implanted into a substrate 3 of semiconductor material and, taken in pairs, correspond to the circuits aforesaid as follows:

the amplifiers 4 and 5 are mounted in parallel as in FIG. 1, the amplifiers 5 and 6 are mounted in antiparallel as in FIG. 2.

It will readily be apparent that, in the three configurations considered, the amplifiers are identical and their basic design as well as the materials selected (GaAs, AlGaAs, ... etc.) make it possible to operate at frequencies at least is high as those at which the package is to be measured.

Moreover, in view of the fact that an amplifier is often limited to a single transistor at microwave frequencies, the two or three amplifiers can advantageously be implanted in the chip of a microwave integrated circuit which is encapsulated in the package whose characteristics are to be measured.

In all cases, the two or three amplifiers of the measuring circuits meet the following specifications:

inverting or non-inverting linear transfer function ($vs = A\ ve$), input impedance corresponding to the input impedance of the devices of the logic family to be encapsulated, output impedance identical with the output impedance of the circuits of the logic family to be encapsulated.

All precautions are taken in regard to implantation of these circuits with a view to ensuring that the internal electrical coupling is zero, viz:

spaced signal lines (very loose implantation), separate power supplies for the amplifiers.

FIG. 4 is a diagram representing the method of measurement of the coefficient of transmission of a package. For the sake of enhanced simplicity, this figure shows only the following circuit elements:

the chip 1 of the measuring circuit, two package access connections 7 and 8, wire or strip connections 9 and 10 between the amplifier 4 and the connections 7 and 8.

The amplifier 5 is not employed for measuring the coefficient of transmission.

Let the reference 7 designate the input connection and the reference 8 designate the output connection of the package: in the package of French patent Application No. 82 11 399, these connections are microstrips adapted to the utilization frequency.

Let the reference T designate the coefficient of transmission of the package: this coefficient is divided into T/2 at the input of the package and T/2 at the output of said package. It is the result of parasitic elements such as capacitance, inductance of the strips 9 and 10, leakages in dielectrics, and so on.

If a known electric signal $V_e$ such as a pulse train is sent to the input connection 7, it is possible to measure a signal $V_S$ on the output connection 8 which is of the form $$V_S = A \cdot V_e \cdot T$$

where A is the gain of the amplifier 4. The coefficient of transmission T $$T = (1/A) \cdot (V_s/V_e)$$

is thus measured at the utilization frequency of the package.

The value T being known, it is possible to measure the coupling between two adjacent access connections employed as inputs. As shown in FIG. 5, a measuring circuit in accordance with FIG. 1 or FIG. 3 is so arranged that the input of the first amplifier 4 is connected by means of a strip 9 to the input connection 7 and its output is not connected. The input of the amplifier 5 which is parallel to the amplifier 4 is connected to an external connection 11 which is adjacent to the connection 7. The output of said amplifier is connected to an external connection 12 on one edge of the casing opposite to the edge which supports the input connections 7 and 11.

An input signal $V_e$ is applied to the connection 7. Thus the amplifier 5 delivers the output signal $V_S$ if a coupling $C_{E/E}$ exists between the inputs 7 and 11.

$$V_S = C_{E/E} \cdot A \cdot V_e \cdot T$$

$$C_{E/E} = (1/A) \cdot (1/T) \cdot (V_s/V_e)$$

In order to measure the coupling coefficient between two adjacent output connections, the wiring scheme of FIG. 6 is adopted. In a measuring circuit as shown in FIG. 1 or is FIG. 3, a first amplifier 4 is connected by means of strips 9 and 10 to the input connection 7 and to the first output connection 8. The second amplifier 5 which is parallel to the first amplifier 4 has a grounded input and an output connected to a second output connection 12 which is adjacent to the first output 8.

An input signal $V_e$ is applied to the connection 7. Thus the amplifier 5 delivers an output signal $V_{S2}$ if there is a coupling $C_{S/S}$ with the signal $V_{S1}$ between the two output connections 8 and 12.

$$V_{S2} = C_{S/S} \cdot V_{S1} = C_{S/S} \cdot A \cdot V_e \cdot T$$

$$C_{S/S} = (1/A) \cdot (1/T) \cdot V_{S2}/V_e$$

If two adjacent connections on the same edge of the package are employed in one case at the input and in the other case at the output, the wiring scheme of FIG. 7 is adopted for determining the input/output coupling coefficient $C_{E/S}$.

The measuring circuit employed is that of FIG. 2 or the portion of FIG. 3 in which two amplifiers 5 and 6 are mounted in antiparallel or top-to-tail relation.

The input of the amplifier 5 is connected to the input connection 11 and the output of said amplifier is not connected. The input of the amplifier 6 is connected to ground and its output is connected to the connection 15 which s adjacent to the input connection 11.

In this cast, coupling takes place directly between the two input-output microstrips 11 and 15. Since the microstrips 12 and 16 located on the opposite edge of the package are not connected to anything, the gain A of the amplifiers and the coefficient of transmission T of the package are of no practical use. The output signal $V_s$ is directly derived from the input signal $V_e$ by the coupling $C_{E/S}$ between the connections 11 and 15:

$$V_s = C_{E/S} \cdot V_e$$

$$C_{E/S} = (V_s/V_e)$$

Finally, FIG. 8 illustrates the case of measurement of the coupling coefficient between an output and an input which are located on the same edge of the package but separated by a screen constituted by one or two grounded connections 19 and 20.

The measuring circuit employed is that of FIG. 2 or of FIG. 3 in which two amplifiers 5 and 6 are implanted in antiparallel or top-to-tail relation. The amplifier 5 is connected to two connections 11 and 12 and the amplifier 6 is connected to two connections 15 and 16. Thus the adjacent connections 12 and 16 on one edge of the package are coupled and the connections 11 and 15 on another edge of the package are separated by the screen of connections 19 and 20. Should a coupling exist between the connections 11 and 15, said coupling is established via the connections 12 and 16.

In the case shown in FIG. 4, we have:

$$V_{S2} = A \cdot V_{e2} \cdot T$$

but the signal $V_{e2}$ on the connection 16 exists only because there is a coupling $C_{S/E}$ with the signal $V_{S1}$ on the connection 12:

$$V_{e2} = C_{S/E} \cdot V_{S1} = C_{S/E} \cdot A \cdot V_{e1} \cdot T$$

therefore $$V_{S2} = A \cdot T \cdot C_{S/E} \cdot A \cdot V_{e1} \cdot T$$

$$C_{S/E} = 1/(A^2 \cdot T^2) \cdot (V_{S2}/V_{e1})$$

FIGS. 4 to 8 show a two-amplifier circuit in accordance with FIGS. 1 and 2 and remain valid if, instead of mounting two circuits in a package for the dynamic measurements to be performed on this latter, only one circuit is mounted as in FIG. 3, the amplifiers of which are employed in pairs according to the type of measurement to be carried out.

When a package is defined in dynamic performance, the measuring circuit or circuits can be unsoldered and the utilization integrated circuit is soldered within the package.

The field of application of the invention extends to all areas of high-speed electronics in which encapsulation of families of circuits having very high performances is a matter of particular concern. The scope of the present invention in no way excludes new generations of silicon integrated circuits having highly advantageous speed characteristics and specifications.

What is claimed is:

1. A method for measuring the coefficient of transmission T between an input connection and an output connection of an encapsulating package for a high speed integrated circuit, comprising a steps of:
    mounting measuring circuit within the package;
    connecting one input of the package to the input of an amplifier by means of a metallic strip;
    connecting one output connection of the package to the output of the amplifier by means of a metal strip;
    sending a signal ($V_e$) to the input connection, and obtaining an output signal ($V_S$) equal to:
    $V_S = A \cdot V_e \cdot T$ whence $T = (1/A) \cdot (V_s/V_e)$ where A is the gain of the amplifier.

2. A measuring circuit for measuring the dynamic characteristics of a package which is to be used for encapsulating an integrated circuit operated at or above one GHz, the integrated circuit having an input impedance and an output impedance, said measuring circuit comprising:
    a supporting substrate of semiconductor material, said supporting substrate having a top portion, said top portion of said supporting substrate having a front and a back;
    a first amplifier and a second amplifier connected to said top portion of said supporting substrate, said first amplifier and said second amplifier are identical and both have an input impedance and an output impedance identical to the input impedance and the output impedance of the integrated circuit;
    a first metal contact of a first terminal of said first amplifier being located at the front of said top portion of said supporting substrate and a second metal contact of a second terminal of said first amplifier being located at the back of said top portion of said supporting substrate;
    a first metal contact of a first terminal of said second amplifier being located at the front of said top portion of said supporting substrate and a second metal contact of a second terminal of said second amplifier being located at the back of said top portion of said amplifier;

said first and second metal contacts of said first amplifier being separated by a predetermined distance from said first and second metal contacts of said second amplifier;

wherein first amplifier and said second amplifier are mounted in an antiparallel manner; and wherein the first metal contact of said first amplifier is an input metal contact and the first metal contact of said second amplifier is an output metal contact.

3. A measuring circuit for measuring the dynamic characteristics of a package which is to be used for encapsulating an integrated circuit operated at or above one GHz, the integrated circuit having an input impedance and an output impedance, said measuring circuit comprising:

a supporting substrate of semiconductor material, said supporting substrate having a top portion, said top portion of said supporting substrate having a front and a back;

a first amplifier and a second amplifier connected to said top portion of said supporting substrate, said first amplifier and said second amplifier are identical and both have an input impedance and an output impedance identical to the input impedance and the output impedance of the integrated circuit;

a first metal contact of a first terminal of said first amplifier being located at the front of said top portion of said supporting substrate and a second metal contact of a second terminal of said first amplifier being located at the back of said top portion of said supporting substrate;

a first metal contact of a first terminal of said second amplifier being located at the front of said top portion of said supporting substrate and a second metal contact of a second terminal of said second amplifier being located at the back of said top portion of said amplifier;

said first and second metal contacts of said first amplifier being separated by a predetermined distance from said first and second metal contacts of said second amplifier; and a third amplifier mounted in parallel with said first amplifier and mounted in an antiparallel manner with said second amplifier.

* * * * *